US007739098B2

(12) United States Patent
Küçükçakar et al.

(10) Patent No.: US 7,739,098 B2
(45) Date of Patent: Jun. 15, 2010

(54) SYSTEM AND METHOD FOR PROVIDING DISTRIBUTED STATIC TIMING ANALYSIS WITH MERGED RESULTS

(75) Inventors: Kayhan Küçükçakar, Sunnyvale, CA (US); Steve Hollands, County Dublin (IE); Brian Clerkin, Dublin (IE); Loa Mize, Tigard, OR (US); Qiuyang Wu, Portland, OR (US); Subramanyam Sripada, Hillsboro, OR (US); Andrew J. Seigel, Los Gatos, CA (US)

(73) Assignee: Synopsys, Inc., Mountain View, CA (US)

( * ) Notice: Subject to any disclaimer, the term of this patent is extended or adjusted under 35 U.S.C. 154(b) by 654 days.

(21) Appl. No.: 10/773,058

(22) Filed: Feb. 4, 2004

(65) Prior Publication Data

US 2005/0172250 A1 Aug. 4, 2005

(51) Int. Cl.

| | |
|---|---|
| ***G01R 15/00*** | (2006.01) |
| ***G01R 31/00*** | (2006.01) |
| ***G01R 25/00*** | (2006.01) |
| ***G01D 18/00*** | (2006.01) |
| ***G01M 19/00*** | (2006.01) |
| ***G06G 7/48*** | (2006.01) |
| ***G06F 17/50*** | (2006.01) |
| ***G06F 11/00*** | (2006.01) |
| ***H04L 7/00*** | (2006.01) |

(52) U.S. Cl. ............................ 703/19; 702/57; 702/58; 702/79; 702/89; 702/125; 703/3; 703/4; 703/13; 703/14; 714/55; 714/814; 714/815; 716/4; 716/5; 716/6

(58) Field of Classification Search .................. 703/19, 703/3, 4, 13, 14; 702/57, 58, 79, 89, 125; 714/55, 814, 815; 716/4, 5, 6

See application file for complete search history.

(56) References Cited

U.S. PATENT DOCUMENTS 4,589,052 A * 5/1986 Dougherty .................. 361/94
4,924,430 A * 5/1990 Zasio et al. .................... 716/6

(Continued)

OTHER PUBLICATIONS

Schulz, Steven. 'Focus Reports: Timing Analysis' EETimes Online, 2000.*

(Continued)

*Primary Examiner*—Kamini S Shah
*Assistant Examiner*—Shambhavi Patel
(74) *Attorney, Agent, or Firm*—Bever, Hoffman & Harms, LLP; Jeanette S. Harms

(57) ABSTRACT

Static timing analysis attempts to exhaustively analyze all critical paths of a design. With ever decreasing geometries and ever increasing design complexity, manually identifying timing violations with standard static timing analysis can be very complex and time consuming. A static timing analysis tool can advantageously manage multiple runs having different modes and corners and automatically merge the results generated by the runs. The STA tool can perform the runs either in parallel or in series. Advantageously, the STA tool can save the full timing analysis generated by each run and then extract information from these saved results to form merged results for the design. These merged results can provide different levels of analysis coverage, supply path information at various levels of detail, allow selectable accessibility to information, and highlight propagation of timing changes/violations in the design.

62 Claims, 3 Drawing Sheets

U.S. PATENT DOCUMENTS

| | | | | |
|---|---|---|---|---|
| 5,095,454 | A * | 3/1992 | Huang | 703/19 |
| 5,579,510 | A * | 11/1996 | Wang et al. | 716/6 |
| 5,650,938 | A * | 7/1997 | Bootehsaz et al. | 716/6 |
| 5,872,717 | A * | 2/1999 | Yu et al. | 716/6 |
| 5,946,475 | A * | 8/1999 | Burks et al. | 716/6 |
| 6,083,273 | A * | 7/2000 | Takeuchi | 716/6 |
| 6,327,557 | B1 * | 12/2001 | Croix | 703/14 |
| 6,415,402 | B2 * | 7/2002 | Bishop et al. | 714/724 |
| 6,925,621 | B2 * | 8/2005 | Mielke et al. | 716/6 |
| 2002/0070775 | A1 * | 6/2002 | Chiu | 327/141 |
| 2003/0009318 | A1 * | 1/2003 | Amatangelo et al. | 703/19 |
| 2003/0237067 | A1 * | 12/2003 | Mielke et al. | 716/6 |
| 2004/0044976 | A1 * | 3/2004 | Schultz | 716/6 |
| 2004/0221252 | A1 * | 11/2004 | Lichtensteiger et al. | 716/6 |
| 2005/0065765 | A1 * | 3/2005 | Visweswariah | 703/19 |

OTHER PUBLICATIONS

Jiang et al. 'Post-Layout Logic Restructuring for Performance Optimization'. ACM 1997.*

Ernst et al. "Razor: A Low-Power Pipleline Based on Circuit-Level Timing Speculation". Proceedings of the 36th International Symposium on Microarchitecture: IEEE 2003.*

Ernst et al. "Razor: A Low-Power Pipleline Based on Circuit-Level Timing Speculation". Proceedings of the 36th International Symposium on Microarchitecture: IEEE 2003.*

Chen et al. "A New Framework for Static Timing Analysis, Incremental Timing Refinement, and Timing Simulation" IEEE 2000.*

Reorda et al. "Fault List Compaction through Static Timing Analysis for Efficient Fault Injection Experiments" Proceedings of the 17th IEEE International Symposium on Defect and Fault Tolerance in VLSI Systems, 2002 IEEE.*

Franzini et al. "Crosstalk Aware Static Timing Analysis: a Two Step Approach", IEEE.*

Hu, et al. "A Static Timing Analysis Environment Using Java Architecture for Safety Critical Real-Time Systems" Proceedings of the Seventh International Workshop on Object-Oriented Real-Time Dependable Systems, 2002 IEEE.*

Chapman, et al. "Combining Static Worst-Case Timing Analysis and Program Proof", Real-Time Systems, 1996.*

* cited by examiner

Potential Set-Ups For Modes And Corners 208
Design And Generic STA Set-Up 209
STA Tool 204
200C
Design and STA Set-Up 201C
STA Tool 202C
Saved Results 203C
200B
Design and STA Set-Up 201B
STA Tool 202B
Saved Results 203B
200A
Design and STA Set-Up 201A
STA Tool 202A
Saved Results 203A
STA Tool 204
Merged Results 205

Potential Set-Ups For Modes And Corners 308
Design and Generic STA Set-Up 309
STA Tool 304
300A
Design and STA Set-Up 301A
STA Tool 302A
Saved Results 303A
Information 306A
300B
Design and STA Set-Up 301B
STA Tool 302B
Saved Results 303B
Information 306B
300C
Design and STA Set-Up 301C
STA Tool 302C
Saved Results 303C
STA Tool 304
Merged Results 305

SYSTEM AND METHOD FOR PROVIDING DISTRIBUTED STATIC TIMING ANALYSIS WITH MERGED RESULTS

BACKGROUND OF THE INVENTION

1. Field of the Invention

The present invention relates to static timing analysis and in particular to distributed static timing analysis with merged results.

2. Description of the Related Art

Ignoring timing violations during design implementation can result in designs that fail to meet performance specifications or even fail in silicon. Given tight market windows and multi-million dollar re-spin costs, these design failures can be financially devastating to semiconductor companies. Therefore, design engineers are increasingly demanding techniques to identify timing violations in a design. One such technique, called static timing analysis, attempts to exhaustively analyze all critical paths of a design.

A limited number of static timing analysis (STA) runs, e.g. to provide a minimum time analysis and a maximum time analysis, can be sufficient for large process geometries and/or simple designs. FIG. 1A illustrates an exemplary run 100 in which an STA tool 102 receives a design (e.g. a gate-level description) and an STA set-up 101. STA tool 102 performs the static timing analysis and generates results 103 indicating any timing violations as well as coverage of the static timing analysis. At this point, a user could review results 103 and then attempt to fix the conditions that could be causing the timing violations, if present.

Unfortunately, with process geometries reaching 130 nm and below, gate counts exceeding 30 million, and designs growing in logic and core complexity, identifying timing violations with standard static timing analysis is rapidly becoming one of the most challenging problems for design engineers. Specifically, multiple runs of static timing analysis are typically required to take into account different modes (e.g. test mode, normal operation mode, power-down mode, etc.) as well as corners (e.g. process parameters including minimum and maximum temperature, minimum and maximum voltage, etc.).

FIG. 1B illustrates a flow wherein a user (e.g. a design engineer) 112 uses a design and a generic STA set-up 110 as well as potential set-ups 111 (indicating specific modes and corners available to user 112) to perform multiple runs 10A, 100B, and 100C. For example, in run 10A, STA tool 102A receives a design and an STA set-up 101A that indicates a specific mode and corner for analysis. STA tool 102A performs the static timing analysis and generates results 103A indicating any violating paths as well as coverage of the static timing analysis using that specific mode and corner. In run 100B, STA tool 102B considers design and STA set-up 101B (same design, but different mode and/or corner) to generate results 103B. Similarly, in run 100C, STA tool 102C considers design and STA set-up 101C (same design, but different mode and/or corner than those indicated in design and STA set-ups 101A and 101B) to generate results 103C. Note that STA tools 102A-102C are running independently. That is, STA tools 102A-102C could be running on the same computer or on different computers and could be running at the same time or at different times.

As STA tools 102A-102C complete their analysis, user 112 can review the results of the static timing analysis and perform debugging 113, as necessary, to mitigate timing violations. Of importance, user 112 must manually perform this user analysis/debugging 113 on results 103A-103C. Unfortunately, results 103A-103C typically form large, complex files in which each critical path in the design must be individually extracted for path profiling. Moreover, performing a comprehensive static timing analysis using available modes and corners can take many runs, e.g. 100-200 runs. Therefore, managing and/or merging the results from these runs can be very complex and time consuming.

Therefore, a need arises for a system and method of efficiently managing multiple static timing analysis runs using multiple modes/corners.

SUMMARY OF THE INVENTION

To ensure that a design meets performance specifications and can be successfully implemented in silicon, a user can perform static timing analysis on the design. Static timing analysis attempts to exhaustively analyze all critical paths of a design. Currently, a user debugs the design by manually analyzing the results of static timing analysis. With ever decreasing geometries and ever increasing design complexity, identifying timing violations with standard static timing analysis can be very complex and time consuming.

In accordance with one feature of the invention, a static timing analysis tool can manage multiple runs having different parameters and automatically merge the results of these runs. Parameters can include, but are not limited to, modes (e.g. test mode, normal operation mode, power-down mode, etc.) and corners (e.g. process parameters including minimum and maximum temperature, minimum and maximum voltage, etc.).

The STA tool can perform the runs either in parallel or in series. Advantageously, the STA tool can save the full timing analysis generated by each run and then extract information from these saved results to form merged results for the design. In one embodiment including a plurality of modes and corners, the multiple static timing analysis runs can share information, and the plurality of modes and corners can be automatically analyzed to determine shared information between parallel runs.

Merged results can provide different levels of analysis coverage. For example, the merged results can indicate whether the design has been exhaustively analyzed for a particular mode and/or corner. Additionally, the merged results can indicate percentage coverage, i.e. how much of the total chip has been analyzed. Furthermore, the merged results can indicate timing checks that were not performed.

The merged results can also provide path information at various levels of detail. For example, merged results can indicate, for each path, timing violations based on specific modes and/or corners. In another embodiment, the merged results can indicate for each path in the design a percentage of times that timing violations exist for all analyzed modes/corners. In yet another embodiment, the merged results can include detailed timing information regarding each path. Thus, the merged results can now provide a depth of path analysis that to date has not been commercially available in the industry.

The merged results can also allow selectable accessibility to information generated in the multiple runs. For example, merged results can be organized as a database, wherein a user can access information at a desired level of detail. Certain desired information can be designated (by the user or by default) before the analysis, thereby accelerating the production of reports including such merged results.

In one embodiment, saving results from each run can include restoring the database and making additional queries.

The additional queries can be made from one or more runs. Advantageously, each query can add additional results to the saved results of each run.

The merged results can also highlight propagation of timing changes/violations in the design. For example, changing the speed of one cell in the design could impact violations in a certain percentage of paths. Therefore, the merged results can allow a user to quickly "leverage up" information.

In one embodiment, a predetermined set of parameters can be modified after completing an initial multi-mode/multi-corner analysis. At this point, an analysis can be performed to provide a what-if capability, thereby driving design optimization.

Therefore, using distributed processing, static time analysis can be performed thoroughly and efficiently. Moreover, by merging the results of such processing and extracting desired information at various levels of detail, a user can quickly and intelligently make decisions in debugging a design.

DETAILED DESCRIPTION OF THE FIGURES

Advanced chip technologies and increasingly complex designs typically require many runs of static timing analysis to ensure that possible timing violations are found before chip layout. Each run can use a specific mode and/or corner. Exemplary modes include, but are not limited to test mode, normal operation mode, and power-down mode. Exemplary corners include, but are not limited to, process parameters such as minimum temperature, maximum temperature, minimum voltage, and maximum voltage.

In accordance with one feature of the invention, a static timing analysis (STA) tool can advantageously manage these runs and automatically merge the results of these runs. These merged results can be organized to facilitate user review, thereby simplifying debugging of the design. To accelerate the runs, the STA tool can manage the multiple runs in parallel. Alternatively, to leverage information generated in a run, the STA tool can manage the multiple runs in series.

Figure 2:
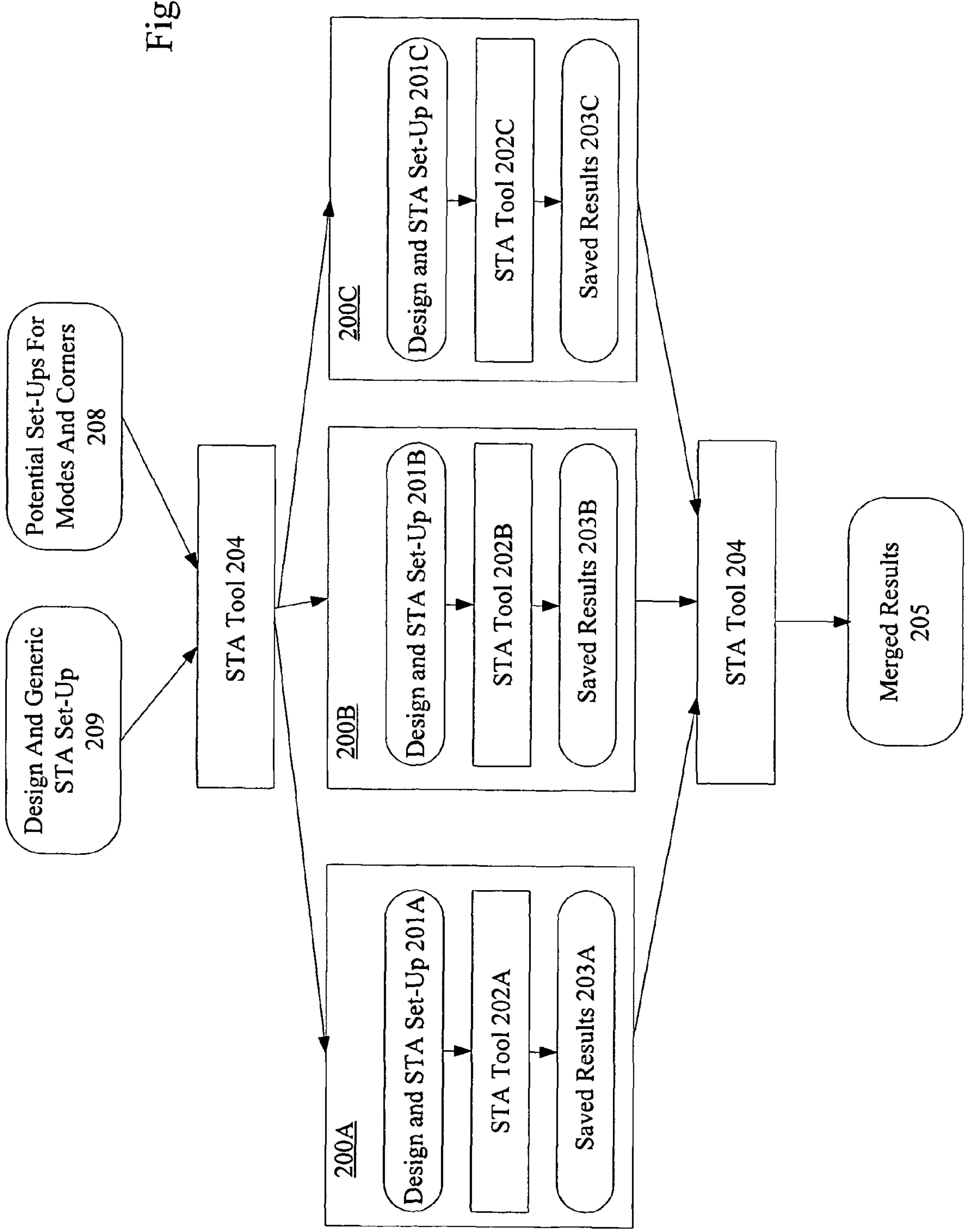
FIG. 2 illustrates a flow wherein an STA tool can receive a design and manage multiple parallel runs (each run being performed with a predetermined mode and corner) analyzing that design. In this flow, the STA tool can automatically analyze and/or merge the results from the runs.

FIG. 2 illustrates an exemplary flow in which the multiple runs are managed in parallel. In this flow, an STA tool 204 can receive a design and a generic STA set-up 209 as well as one or more potential set-ups 208 that specify modes and/or corners available for design analysis. STA tool 204 can then initiate multiple parallel runs using the available set-ups. Note that although three runs 200A, 200B, and 200C are shown, an actual design analysis could include hundreds of runs. Of importance, each run can be performed with a different mode and/or corner.

In accordance with this embodiment, one or more STA tools can be used in parallel to perform the runs. For example, an STA tool 202A can receive the design and an STA set-up 201A, perform the static timing analysis using a specified mode and corner on the design, and then save results 203A from that static timing analysis in a database. An STA tool 202B can receive the design and STA set-up 201B, perform the static timing analysis using another specified mode and corner on the design, and then save results 203B from that analysis. Similarly, STA tool 202C can receive the design and STA set-up 201C, perform the static timing analysis using the specified mode and corner on the design, and then save results 203C.

In this embodiment, STA tool 204 can schedule STA tools 202A, 202B, and 202C to perform their static timing analysis in parallel, thereby significantly improving overall run time. Advantageously, STA tool 204 (shown twice in FIG. 2 to clarify the process flow) can automatically combine the results of those runs in merged results 205, thereby facilitating an efficient user review. In one embodiment, STA tool 204 can merge results 203A, 203B, and 203C after all static timing analysis is complete. In another embodiment, STA tool 204 can merge the results as they become available, thereby providing an increasingly more accurate merged results database over time.

In one embodiment, saving results from each run 200A, 200B, and 200C can include restoring (i.e. reading) the merged results database and making additional queries. The additional queries can be made from one or more runs. Advantageously, each query can add additional results to saved results 203A, 200B, 200C of each run 200A, 200B, and 200C. In another embodiment, saved results 203A, 203B, and 203C can include intermediate results to support arbitrary queries. These intermediate results can include a predetermined set of parameters that can be advantageously used in creating additional results.

Exemplary saved results 203A, 203B, or 203C can include one or more of cell delays, net delays, transition times, a timing graph, a parasitic network, path reports, bottleneck reports, a noise bump height, a noise bump width, a noise peak time, aggressors, victims, noise rejection curves, noise slack, current density, application attributes, user attributes, cells, nets, an analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

Note that in any mode certain parts of the design can be disabled. Saved results 203A-203C can therefore indicate what part(s) of the design have/have not been analyzed. STA tool 204 can quickly and accurately merge this complex coverage information from runs 200A-200C.

Therefore, in accordance with one feature of the invention, merged results 205 can advantageously provide different levels of analysis coverage. For example, merged results 205 can indicate whether the design has been exhaustively analyzed for a particular mode and/or corner. Merged results 205 can also indicate percentage coverage, i.e. how much of the total chip has been analyzed. Merged results 205 can also indicate any timing checks that were not performed.

In accordance with another feature of the invention, merged results 205 can advantageously provide path information at various levels of detail. For example, in one embodiment, merged results 205 can indicate, for each path, timing violations based on specific modes and/or corners. In another embodiment, merged results 205 can indicate for each path in the design a percentage of times that timing violations exist for all analyzed modes/corners. In yet another embodiment, merged results 205 can include detailed timing information regarding each path. Thus, merged results 205 can now provide a depth of analysis for each path that to date has not been commercially available in the industry.

In accordance with yet another feature of the invention, merged results 205 can advantageously allow user-selected accessibility to information generated in the multiple runs. For example, merged results 205 can be organized as a database, wherein a user can access information at a desired level of detail. For example, a user could query merged results 205 regarding violations for a specific path in normal operation mode under all corners. The user could also query merged results 205 regarding violations for all paths on the chip in all modes under a specific corner, e.g. a high temperature condition. Thus, merged results 205 can provide users with a selectable level of analysis.

In accordance with yet another feature of the invention, merged results 205 can advantageously highlight propagation of timing changes/violations in the design. For example, changing the speed of one cell in the design could impact violations in a certain percentage of paths. Using merged results 205, these paths can now be identified. Therefore, merged results 205 can advantageously allow a user to quickly "leverage up" information.

Exemplary merged results 205 can include one or more of cell delays, net delays, transition times, timing graph, parasitic network, path reports, bottleneck reports, a noise bump height, a noise bump width, a noise peak time, aggressors, victims, noise rejection curves, noise slack, current density, application attributes, user attributes, cells, nets, analysis coverage, profiling of endpoints, profiling of paths, modes, case analysis propagation, design corner description, slack, design cost, constraints, annotations, combinational loops, clock reconvergence points, arrival times, required times, a timing window, crosstalk delays, and operating conditions.

Figure 1B:
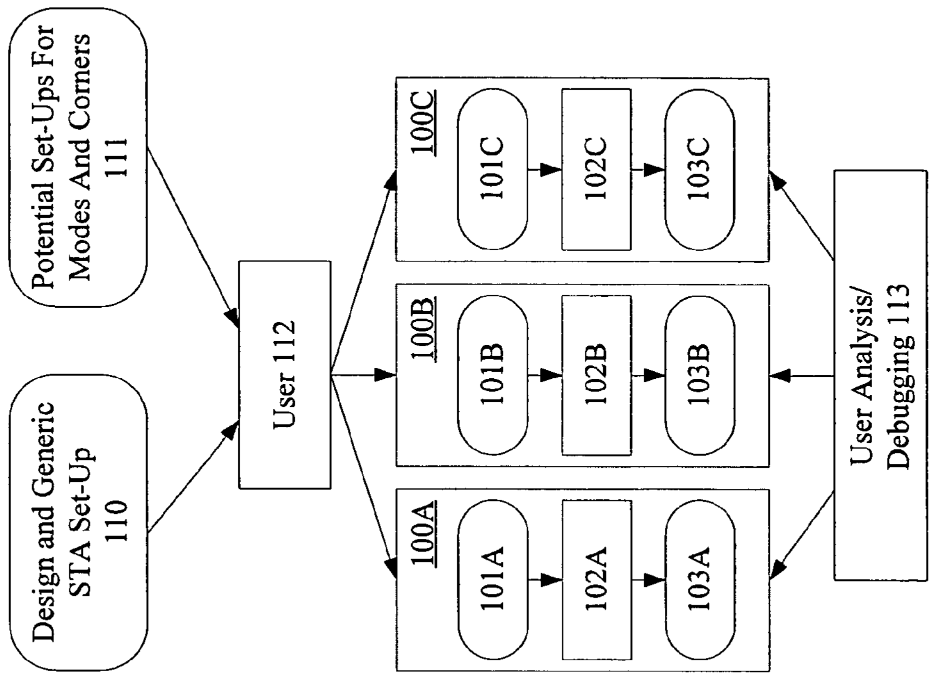
FIG. 1B illustrates a flow wherein multiple runs can be performed, each run specifying a different STA set-up to analyze a design. In this flow, the user manually analyzes and debugs the results from the runs.
Figure 1A:
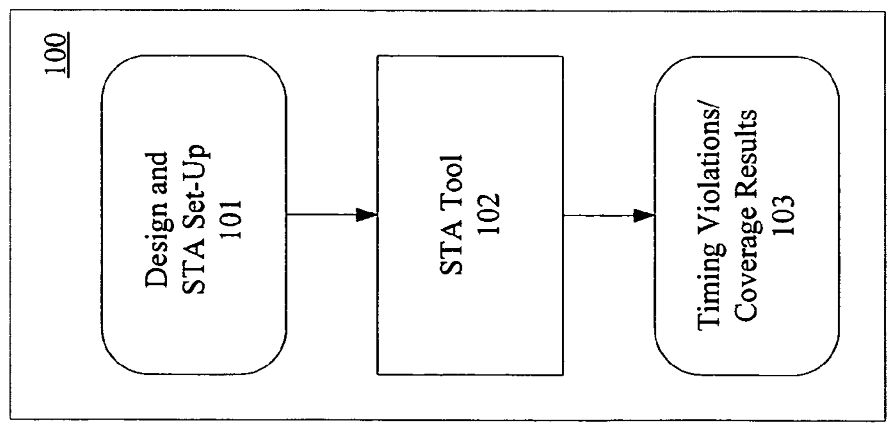
FIG. 1A illustrates an exemplary run in which an STA tool receives a design and an STA set-up. During the run, the STA tool performs the static timing analysis and generates results indicating any violating paths as well as coverage of the static timing analysis.

Currently, users must manually extract all of the above-described information from the text files provided by a standard STA tool (e.g. results 103A-103C in FIG. 1B). This manual extraction is extremely time consuming and prone to error. Therefore, in contrast, merged results 205 can dramatically increase the efficiency and accuracy of debugging a design.

Figure 3:
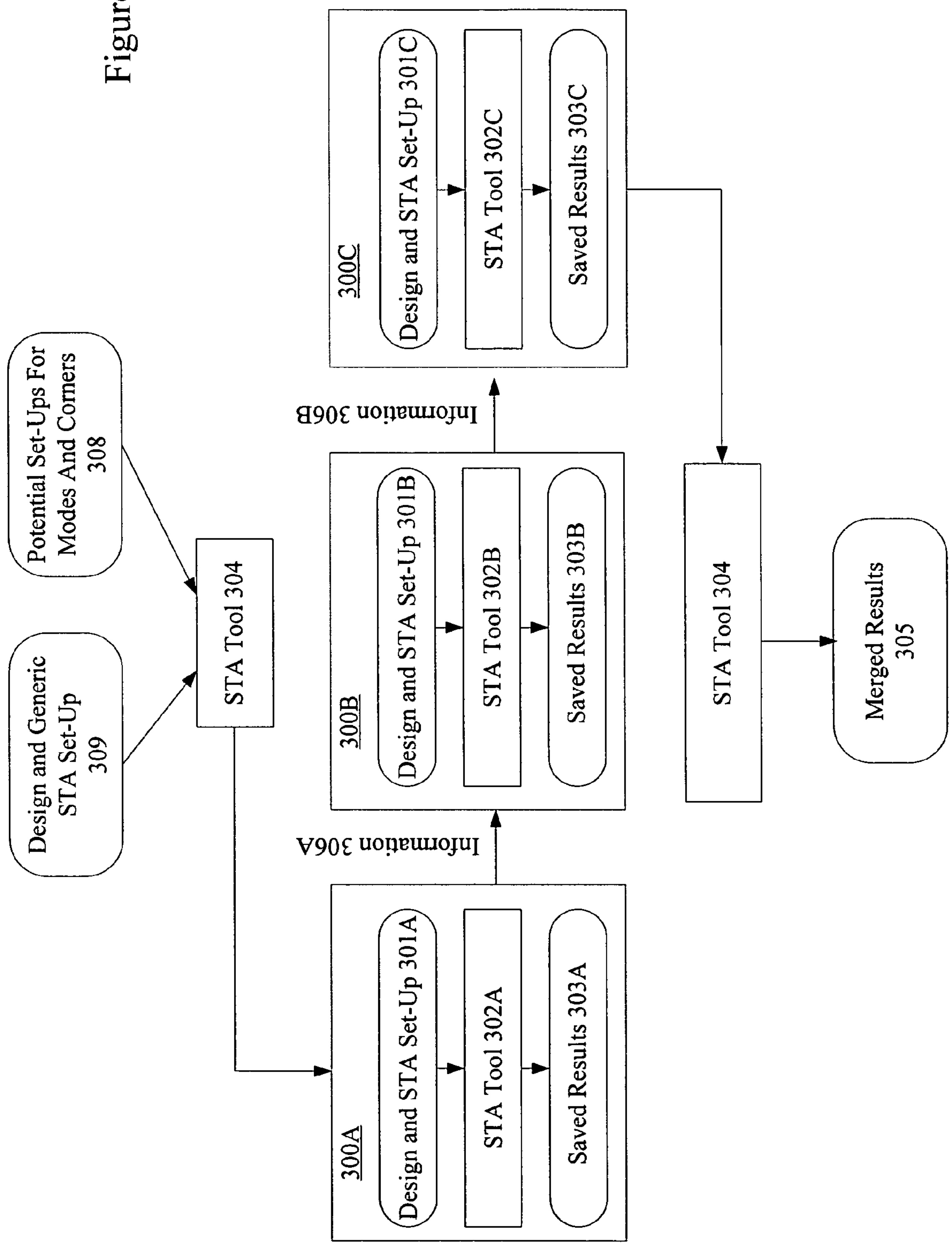
FIG. 3 illustrates a flow wherein an STA tool can receive a design and manage multiple runs in series, thereby allowing a subsequent run to benefit from information provided from a previous run. The STA tool can automatically analyze and organize the results from the serial runs.

FIG. 3 illustrates an exemplary flow in which the multiple runs are managed in series. In this flow, an STA tool 304 can receive a design and a generic STA set-up 309 as well as one or more potential set-ups 308 that specify modes and/or corners available for design analysis. STA tool 304 can then initiate multiple runs to be run in series using the available set-ups. Once again, each run can be performed with a different mode and/or corner.

In this embodiment, an STA tool 302A can receive the design and an STA set-up 301A, perform the static timing analysis using a specified mode and corner on the design, and then save results 303A from that static timing analysis. An STA tool 302B can receive information 306A from run 300A as well as a design and STA set-up 301B, perform the static timing analysis using another specified mode and corner on the design, and then save results 303B from that analysis. Similarly, STA tool 302C can receive information 306B from run 300B as well as a design and STA set-up 301C, perform the static timing analysis using the specified mode and corner on the design, and then save results 303C.

Note that although this incremental flow can be slower than parallel analysis, some important efficiencies can be achieved. For example, in the parallel analysis shown in FIG. 2, the netlist of the design is read for each run 200A, 200B, and 200C. In contrast, in a series analysis (also called an incremental flow), the netlist of the design can be read once in run 300A and then used for subsequent runs 300B and 300C. Therefore, information 306A and 306B could include a netlist of the design. Other information that can be shared between runs could include resistance/capacitance (e.g. parasitic network) information, timing graphs, etc. Therefore, in contrast to the independent runs of parallel analysis, the runs in an incremental flow can be related, i.e. share information. In one embodiment, STA tool 304 can automatically analyze the plurality of modes and corners to determine shared information between runs 300A, 300B, and 300C. This shared information can be provided in merged results 305.

Note that the information provided to downstream runs can include information generated in any previous run. For example, in one embodiment, information 306A can include at least saved results 303A, whereas information 306B can include at least saved results 303A as well as 303B. In this manner, STA tool 304 can merge saved results 303A, 303B, and 303C in merged results 305.

In accordance with one embodiment, STA tool 304 can perform pre-compilation, as appropriate. That is, if certain paths, modes, and/or corners are user-specified for analysis (i.e. reports are predictable), then such information can be provided separately from other data in the saved results. Advantageously, forming first merged results using separate reports for specified information can be done significantly faster than forming second merged results including all saved results (i.e. in batch mode). In other embodiments where user-specified information is not designated (i.e. reports are not predictable), certain default information (e.g. information typically requested by users) can be stored and organized. Once again, forming first merged results using separate reports for the default information could be done significantly faster than forming second merged results including all saved results. In yet other embodiments where specific information is not user-specified and default information is not designated, a user can query the merged results database after final compilation.

In accordance with one embodiment of the invention, a user can have the ability to interact on the fly with any number of runs. Specifically, the user can designate specific information (i.e. on an individual or group basis) for analysis at any time during the run(s). For example, if 20 runs were being simultaneously run and the user predicted that two runs having a certain corner would probably result in bad performance, then the user could interact with that corner in those two runs to confirm or deny that prediction using a separate report in the merged results database. In one embodiment, a user can modify a predetermined set of parameters after completing an initial multi-mode/multi-corner analysis. At this point, an analysis can be performed by STA tool 304 to provide a what-if capability, thereby driving design optimization.

Although illustrative embodiments of the invention have been described in detail herein with reference to the figures, it is to be understood that the invention is not limited to those precise embodiments. They are not intended to be exhaustive or to limit the invention to the precise forms disclosed. For example, STA tool 204 (FIG. 2) can automatically analyze the plurality of modes and corners to determine shared information between parallel runs 200A, 200B, and 200C. This shared information can be provided in merged results 205.

As such, many modifications and variations will be apparent. For example, a method of designing digital circuits could include performing a plurality of static timing analysis for different operation modes, manufacturing process corners, on operating conditions, or ambient environment conditions. The method could further include determining which scenarios should be simultaneously optimized and then optimizing selected scenarios simultaneously in logic synthesis, placement, and routing. Accordingly, it is intended that the scope of the invention be defined by the following claims and their equivalents.

The invention claimed is:

1. A method of performing static timing analysis on a design, the method comprising:

performing multiple static timing analysis runs with the design, each run using a predetermined set of parameters including a plurality of modes and corners;

saving intermediate results from the multiple static timing analysis runs;

analyzing the intermediate results to automatically construct merged results, the analyzing including:

identifying any first portions of the design that have not been analyzed;

identifying any second portions of the design that have been exhaustively analyzed for all mode and corner combinations; and identifying any third portions of the design, the third portions of the design being other than the first and second portions, the third portions being less than exhaustively analyzed for all mode and corner combinations, wherein identifying each third portion includes identifying a level of analysis and a set of mode and corner combinations; and outputting the merged results including information regarding the second and third portions.

2. The method of claim 1, wherein the multiple static timing analysis runs share information.

3. The method of claim 1, wherein the multiple static timing analysis runs are performed in parallel.

4. The method of claim 1, wherein the multiple static timing analysis runs are performed in series.

5. The method of claim 1, wherein saving intermediate results includes forming a database that can be queried at different levels of detail.

6. The method of claim 5, wherein saving intermediate results includes restoring the database and making additional queries.

7. The method of claim 6, wherein the additional queries can be made from one or more runs.

8. The method of claim 7, wherein each query adds additional results to the saved intermediate results of each run.

9. The method of claim 1, wherein the saved intermediate results support arbitrary queries.

10. The method of claim 9, wherein the intermediate results include a predetermined set of parameters that are used in creating additional results.

11. The method of claim 1, wherein the saved intermediate results include results of predetermined queries.

12. The method of claim 1, wherein the saved intermediate results include at least one of cell delays, net delays, transition times, a timing graph, a parasitic network, path reports, bottleneck reports, a noise bump height, a noise bump width, a noise peak time, aggressors, victims, noise rejection curves, noise slack, current density, application attributes, user attributes, cells, nets, an analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

13. The method of claim 1, further including reporting the merged results, wherein the reported results include at least one of cell delays, net delays, transition times, timing graph, parasitic network, path reports, bottleneck reports, a noise bump height, a noise bump width, a noise peak time, aggressors, victims, noise rejection curves, noise slack, current density, application attributes, user attributes, cells, nets, analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

14. The method of claim 1, wherein performing the multiple static timing analysis runs allows multiple modes and corners to be analyzed simultaneously.

15. The method of claim 14, further including modifying a predetermined set of parameters after completing an initial multi-mode/multi-corner analysis, and performing a design optimization.

16. A method of performing static timing analysis on a design, the method comprising:

performing multiple static timing analysis runs with the design, each run using a predetermined set of parameters including a plurality of modes and a corners;

saving intermediate results from the multiple static timing analysis runs; and analyzing the intermediate results to automatically construct merged results, wherein user-desired information regarding a predetermined set of mode and corner combinations is merged before other information, wherein the merged results indicate: what parts of the design have not been analyzed, whether the design has been exhaustively analyzed for a particular corner and mode combination, and whether the design has been exhaustively analyzed for all corner and mode combinations, and wherein the merged results associated with the user-desired information are user-accessible before the merged results associated with the other information.

17. A computer-readable medium comprising instructions, that when executed by a processor, provide instructions for generating merged results from multiple static timing analysis runs, the instructions comprising:

a first set of instructions for performing the multiple static timing analysis runs with a design, each run using a predetermined set of parameters including a plurality of modes and corners;

a second set of instructions for saving intermediate results from the multiple static timing analysis runs; and a third set of instructions for analyzing the intermediate results to automatically construct and output merged results, the third set of instructions including:

instructions for identifying any first portions of the design that have not been analyzed;

instructions for identifying any second portions of the design that have been exhaustively analyzed for all mode and corner combinations; and instructions for identifying any third portions of the design, the third portions of the design being other than the first and second portions, the third portions being less than exhaustively analyzed for all mode and corner combinations, wherein identifying each third portion includes identifying a level of analysis and a set of mode and corner combinations; and instructions for outputting the merged results including information regarding the second and third portions.

18. The computer-readable medium of claim 17, further comprising a fourth set of instructions for sharing information between the multiple static timing analysis runs.

19. The computer-readable medium of claim 17, further comprising a fourth set of instructions for performing the multiple static timing analysis runs in parallel.

20. The computer-readable medium of claim 17, further comprising a fourth set of instructions for performing the multiple static timing analysis runs in series.

21. The computer-readable medium of claim 17, wherein the second set of instructions for saving intermediate results includes instructions for forming a database that can be queried at different levels of detail.

22. The computer-readable medium of claim 17, wherein the first set of instructions for performing the multiple static timing analysis runs includes instructions that allow multiple modes and corners to be analyzed simultaneously.

23. A computer-readable medium comprising instructions, that when executed by a processor, provide instructions for generating merged results from multiple static timing analysis runs, the instructions comprising:

a first set of instructions for performing the multiple static timing analysis runs with a design, each run using a predetermined set of parameters including a plurality of modes and corners;

a second set of instructions for saving intermediate results from the multiple static timing analysis runs;

a third set of instructions for analyzing the intermediate results to automatically construct merged results, the merged results indicating: what parts of the design have not been analyzed, whether the design has been exhaustively analyzed for a particular corner and mode combination, and whether the design has been exhaustively analyzed for all corner and mode combinations; and a fourth set of instructions for merging user-desired information regarding a predetermined set of corner and mode combinations before merging other information, wherein the merged results associated with the desired information are user-accessible before the merged results associated with the other information.

24. A method of performing static timing analysis on a design, the method comprising:

performing at least one static timing analysis run with the design, each run using a predetermined set of parameters including a plurality of modes and corners;

saving intermediate results from each static timing analysis run to external storage;

reading sets of saved intermediate results;

analyzing the saved intermediate results to automatically construct merged results that provide analysis coverage and path information at multiple levels of detail, wherein analyzing the saved intermediate results includes:

identifying any first portions of the design that have not been analyzed;

identifying any second portions of the design that have been exhaustively analyzed for all mode and corner combinations; and identifying any third portions of the design, the third portions of the design being other than the first and second portions, the third portions being less than exhaustively analyzed for all mode and corner combinations, wherein identifying each third portion includes identifying a level of analysis and a set of mode and corner combinations; and reporting the merged results including information regarding the second and third portions.

25. The method of claim 24, wherein saving intermediate results includes forming a database that can be queried at different levels of detail.

26. The method of claim 25, wherein saving intermediate results further includes restoring the database and making additional queries.

27. The method of claim 26, wherein the additional queries can be made from one or more runs.

28. The method of claim 27, wherein each query adds additional results to the saved intermediate results of each run.

29. The method of claim 24, wherein the saved intermediate results support arbitrary queries.

30. The method of claim 28, wherein the saved intermediate results include a predetermined set of parameters that are used in creating additional results.

31. The method of claim 24, wherein the saved intermediate results include results of predetermined queries.

32. The method of claim 24, wherein the saved intermediate results include at least one of cell delays, net delays, transition times, a timing graph, a parasitic network, path reports, bottleneck reports, a noise bump height, a noise bump width, a noise peak time, aggressors, victims, noise rejection curves, noise slack, current density, application attributes, user attributes, cells, nets, an analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

33. The method of claim 24, further including reporting the merged results, wherein the reported results include at least one of cell delays, net delays, transition times, timing graph, parasitic network, path reports, bottleneck reports, a noise bump height, a noise bump width, a noise peak time, aggressors, victims, noise rejection curves, noise slack, current density, application attributes, user attributes, cells, nets, analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

34. A method of performing static timing analysis on a design, the method comprising:

performing multiple static timing analysis runs with the design, each run using a predetermined set of parameters including a plurality of modes and corners;

saving intermediate results from the multiple static timing analysis runs; and analyzing the intermediate results to automatically construct merged results, the merged results providing path information at multiple levels of detail, the analyzing including:

identifying any first portions of the design that have not been analyzed;

identifying any second portions of the design that have been exhaustively analyzed for all mode and corner combinations; and identifying any third portions of the design, the third portions of the design being other than the first and second portions, the third portions being less than exhaustively analyzed for all mode and corner combinations, wherein identifying each third portion includes identifying a level of analysis and a set of mode and corner combinations; and providing user access to the merged results including information regarding the second and third portions.

35. The method of claim 34, wherein the multiple static timing analysis runs share information.

36. The method of claim 34, wherein the multiple static timing analysis runs are performed in parallel.

37. The method of claim 34, wherein the multiple static timing analysis runs are performed in series.

38. The method of claim 34, wherein saving intermediate results includes forming a database that can be queried at different levels of detail.

39. The method of claim 38, wherein saving intermediate results includes restoring the database and making additional queries.

40. The method of claim 39, wherein the additional queries can be made from one or more runs.

41. The method of claim 40, wherein each query adds additional results to the saved intermediate results of each run.

42. The method of claim 34, wherein the saved intermediate results support arbitrary queries.

43. The method of claim 42, wherein the saved intermediate results include a predetermined set of parameters that are used in creating additional results.

44. The method of claim 34, wherein the saved intermediate results include results of predetermined queries.

45. The method of claim 34, wherein the saved intermediate results include at least one of cell delays, net delays, transition times, a timing graph, a parasitic network, path reports, bottleneck reports, a noise bump height, a noise bump width, a noise peak time, aggressors, victims, noise rejection curves, noise slack, current density, application attributes, user attributes, cells, nets, an analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

46. The method of claim 34, further including reporting the merged results, wherein the reported results include at least one of cell delays, net delays, transition times, timing graph, parasitic network, path reports, bottleneck reports, a noise bump height, a noise bump width, a noise peak time, aggressors, victims, noise rejection curves, noise slack, current density, application attributes, user attributes, cells, nets, analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

47. The method of claim 34, wherein performing the multiple static timing analysis runs allows multiple modes and corners to be analyzed simultaneously.

48. The method of claim 47, further including modifying a predetermined set of parameters after completing an initial multi-mode/multi-corner analysis, and performing a design optimization.

49. A method of performing static timing analysis on a design, the method comprising:

performing multiple static timing analysis runs with paths of the design, each run using a predetermined set of parameters including a plurality of modes and corners;

saving intermediate results from the multiple static timing analysis runs;

analyzing the intermediate results to construct merged results, the merged results indicating for each path a percentage of times that timing violations exist for all analyzed modes and corners; and outputting the merged results.

50. The method of claim 49, wherein the multiple static timing analysis runs are performed in parallel.

51. The method of claim 49, wherein the multiple static timing analysis runs are performed in series.

52. The method of claim 49, wherein saving intermediate results includes forming a database that can be queried at different levels of detail.

53. The method of claim 52, wherein saving intermediate results includes restoring the database and making additional queries.

54. The method of claim 53, wherein the additional queries can be made from one or more runs.

55. The method of claim 54, wherein each query adds additional results to the saved intermediate results of each run.

56. The method of claim 49, wherein the saved intermediate results support arbitrary queries.

57. The method of claim 56, wherein the intermediate results include a predetermined set of parameters that are used in creating additional results.

58. The method of claim 49, wherein the saved intermediate results include results of predetermined queries.

59. The method of claim 49, wherein the saved intermediate results include at least one of cell delays, net delays, transition times, a timing graph, a parasitic network, path reports, bottleneck reports, a noise bump height, a noise bump width, a noise peak time, aggressors, victims, noise rejection curves, noise slack, current density, application attributes, user attributes, cells, nets, an analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

60. The method of claim 49, further including reporting the merged results, wherein the reported results include at least one of cell delays, net delays, transition times, timing graph, parasitic network, path reports, bottleneck reports, a noise bump height, a noise bump width, a noise peak time, aggressors, victims, noise rejection curves, noise slack, current density, application attributes, user attributes, cells, nets, analysis coverage, profiling of endpoints, profiling of paths, modes, case analysis propagation, design corner description, slack, design cost, constraints, annotations, combinational loops, clock re-convergence points, arrival times, required times, a timing window, crosstalk delays, and operating conditions.

61. The method of claim 49, wherein performing the multiple static timing analysis runs allows multiple modes and corners to be analyzed simultaneously.

62. The method of claim 61, further including modifying a predetermined set of parameters after completing an initial multi-mode/multi-corner analysis, and performing a design optimization.

* * * * *

UNITED STATES PATENT AND TRADEMARK OFFICE

CERTIFICATE OF CORRECTION

PATENT NO. : 7,739,098 B2
APPLICATION NO. : 10/773058
DATED : June 15, 2010
INVENTOR(S) : Kayhan Küçükçakar et al.

It is certified that error appears in the above-identified patent and that said Letters Patent is hereby corrected as shown below:

Column 8, line 27, delete "a" (second occurrence).

Column 10, line 18, amend "28" to -- 29 --.

Signed and Sealed this

Sixteenth Day of November, 2010

David J. Kappos
*Director of the United States Patent and Trademark Office*